(12) United States Patent
Uesugi et al.

(10) Patent No.: US 6,309,698 B1
(45) Date of Patent: Oct. 30, 2001

(54) MANUFACTURING PROCESS FOR A LEAD-FRAME FORMING MATERIAL

(75) Inventors: Akio Uesugi; Tsutomu Kakei, both of Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 1275 days.

(21) Appl. No.: 08/572,505

(22) Filed: Dec. 14, 1995

Related U.S. Application Data

(63) Continuation of application No. 08/217,056, filed on Mar. 24, 1994, now abandoned.

(30) Foreign Application Priority Data

Mar. 24, 1993 (JP) .................................................. 5-087799

(51) Int. Cl.⁷ ........................................................ B05D 3/12
(52) U.S. Cl. ............................ 427/178; 427/74; 427/157; 427/327; 427/289
(58) Field of Search ........................... 156/630; 427/74, 427/157, 289, 327, 532, 178

(56) References Cited

U.S. PATENT DOCUMENTS

| | | | |
|---|---|---|---|
| 3,647,443 | * 3/1972 | Rauner et al. | 96/33 |
| 4,028,111 | * 6/1977 | Iwasaki et al. | 96/75 |
| 4,089,733 | * 5/1978 | Zimmerman | 156/630 |
| 4,148,649 | * 4/1979 | Golda et al. | 96/75 |
| 4,259,434 | * 3/1981 | Yamasue et al. | 430/302 |
| 4,441,118 | * 4/1984 | Fister et al. | 357/70 |
| 4,451,845 | * 5/1984 | Philofsky et al. | 357/72 |
| 4,523,218 | * 6/1985 | Kato | 357/70 |
| 4,527,185 | * 7/1985 | Philofsky et al. | 357/70 |
| 4,714,528 | * 12/1987 | Takeuchi et al. | 204/33 |
| 4,872,946 | * 10/1989 | Uesugi et al. | 156/637 |
| 4,909,894 | * 3/1990 | Uesugi et al. | 156/640 |

FOREIGN PATENT DOCUMENTS

0046047 * 2/1982 (EP) .

* cited by examiner

Primary Examiner—Brian K. Talbot
(74) Attorney, Agent, or Firm—Sughrue, Mion, Zinn, Macpeak & Seas, PLLC

(57) ABSTRACT

A manufacturing process for a lead-frame forming material, comprises continuously subjecting a metal web to a degrease treatment and an acid cleaning treatment, coating a light-sensitive material on said metal web, followed by drying to form a light-sensitive layer, and cutting the above coated lead-frame forming metal web thus obtained in fixed lengths along a longitudinal direction or winding said coated lead-frame forming metal web into a roll. The lead-frame having a uniform quality can be produced in large volume.

2 Claims, No Drawings

MANUFACTURING PROCESS FOR A LEAD-FRAME FORMING MATERIAL

This is a Continuation of application Ser. No. 08/217,056 filed Mar. 24, 1994.

FIELD OF THE INVENTION

This invention relates to a manufacturing process for a lead-frame forming material, more specifically to a manufacturing process for a lead-frame forming material, whereby the lead-frame having a uniform quality can be produced in large volume.

BACKGROUND OF THE INVENTION

A lead-frame is a metal frame forming an extension line lead terminal with a die pad which is used for fixing a semiconductor pellet used in a plastic mold IC and a ceramics package IC. There is used for the metal frame, a lead-frame forming metal plate made of alloy mainly containing copper or copper-nickel as a material. In recent years, an element of an active metal series such as titanium and chromium has been added to the material as well. In any event, it is desired that the material used have good mechanical strength, high electric conductivity, high softening temperature, a coefficient of thermal expansion matching the coefficient of thermal expansion of a semiconductor pellet and a package material, secured flatness of a lead, small bending anisotropy, good heat releasing performance, and a low cost. A pattern is formed on the lead-frame forming metal plate by a punching out or by etching with an etchant. Punching can be carried out at a low cost and a precise pattern can be formed by the etching method.

In recent years, development in semiconductor and integrated circuit manufacturing accompanied with an increased demand for electronic parts using lead-frames has resulted in an increased requirement for producing lead-frame having uniform quality in large volume.

In manufacturing lead-frame, there has been used in the past, an alloy plate mainly containing, for example, copper or an alloy plate mainly containing copper-nickel, and in order to remove rust preventives applied on the alloy plate, the alloy plate was subjected in regular succession to a degrease treatment and an acid cleaning treatment. Then, a liquid resist was coated on the plate surface by a wheeler coating method. For example, a light-sensitive layer of a dry type, such as a negative type was deposited and dried to provide a light-sensitive material layer. After the light-sensitive layer was exposed through a prescribed etching pattern, it was then subjected to a developing treatment and any exposed parts of the light-sensitive layer were removed. Then, the alloy plate was dipped in an etchant to form a prescribed etching pattern on the alloy plate surface.

In order to produce a conventional lead-frame having such a pattern formed thereon while having uniform quality in large volume, many sheets of the alloy plates described above were purchased and a lot of these alloy plates were subjected in succession to a degrease treatment to remove rust preventives on the alloy plates and then subjected to an acid cleaning treatment in a batch treatment. Then, a light-sensitive material was coated on the alloy plates thus obtained, followed by drying, to manufacture many sheets of the lead-frame forming metal plates in large volume.

However, in the conventional manufacturing process described above for the lead-frame forming material, whereby a lot of the metal plates were subjected, in succession, to a degrease treatment, then to an acid cleaning treatment in a batch treatment, followed by coating a light-sensitive material on the respective degrease-treated and acid cleaning-treated plates thus obtained, followed by drying, foreign matter tends to get in between the metal plate and the light-sensitive layer, which can cause breaking of wire in the lead-frame thus obtained after forming a pattern. Accordingly, it has been difficult to manufacture lead frames in large volume while maintaining uniform quality.

SUMMARY OF THE INVENTION

The present invention is to provide a manufacturing process for a lead-frame forming material, by which such difficulties in the manufacturing process for a conventional lead-frame forming material are removed and a lead-frame having a uniform quality can be produced in large volume.

In order to achieve the above object, the manufacturing process for a lead-frame forming material of the present invention comprises subjecting a metal web continuously to a degrease treatment, then to an acid cleaning treatment, and, then coating a light-sensitive material on the treated metal web thus obtained, followed by drying to form a light-sensitive layer, and cutting the coated lead-frame forming metal web thus obtained in fixed lengths along a longitudinal direction or winding it into a roll.

DETAILED DESCRIPTION OF THE INVENTION

The metal web is desirably an alloy, mainly containing copper or copper-nickel, or sheet metal made of an alloy prepared by further adding active metal elements such as titanium and chromium thereto or a strip.

Acid and alkali can be used as the degreasing agent for the degrease treatment. More specifically, aqueous solutions of sodium carbonate, phosphoric acid, sulfuric acid, hydrochloric acid, nitric acid, sodium hydroxide, sodium metasilicate, sodium silicate, sodium hexametaphosphate, sodium secondary phosphate, sodium tripolyphosphate, and sodium pyrophosphate can be used. Treatment is carried out under treating conditions of a degreasing agent concentration of 0.01 to 50 %, a temperature of 20 to 90° C., and a treating time of 5 seconds to 5 minutes.

In addition to the treatment described above, the degrease treatment for the metal web under the above conditions may be carried out by an electrolytic degrease treatment in which an electrochemical process is combined. Roughening may be carried out prior to the degrease treatment. A conventional roughening process using a brush can be used.

Carrying out such a degrease treatment generates smut and accordingly, the residue generated has to be removed. This smut can be removed by using phosphoric acid, nitric acid, sulfuric acid, and chromic acid, or a mixture thereof.

In the present invention, a clean plane free of residue is required. It is necessary also to wash the plane with water after each of the processes so that no residual solution is present. Thereafter, a light-sensitive layer is coated onto the web. It is required that the coating process, be carried out continuously and evenly. The light-sensitive solution includes a negative type and a positive type. The negative type includes bichromates+polymer, an aromatic bisazide compound+cyclized rubber, an azide series polymer, a vinyl cinnamate series polymer, a photopolymerizable monomer, and an oligomer. An o-naphthoquinonediazide series is used as well for the positive type. Flexibility and adhesiveness are required of both of the negative type and the positive type.

Further, there can be carried out a potassium fluorinated zirconate treatment described in U.S. Pat. No. 2,946,638; a phosphomolybdate treatment described in U.S. Pat. No. 3,201,247; an alkyl titanate treatment described in British Patent 1,108,559; a polyacrylic acid treatment described in German Patent 1,091,433; a polyvinyl phosphonate treatment described in German Patent 1,134,093 and British Patent 1,230,447; a phosphonic acid treatment described in JP-B-44-6409 (the term "JP-B" as used herein means an examined Japanese patent publication); a phytic acid treatment described in U.S. Pat. No. 3,307,951; a treatment by the salt of a lipophilic organic high molecular compound and divalent metal described in JP-A-58-16893 (the term "JP-A" as used herein means an "unexamined published Japanese patent application") and JP-A-58-18291; to provide a subbing layer of hydrophilic cellulose (for example, carboxymethyl cellulose) containing a water soluble metal salt, for example, lead acetate, as described in U.S. Pat. No. 3,860, 426; to carry out a hydrophilicity treatment by subbing a water soluble polymer having sulfonic acid group, described in JP-A-59-101651; subbing of phosphates described in JP-A-62-019494, the water soluble epoxy compounds described in JP-A-62-033692, phosphoric acid-modified starch described in JP-A-62-097892, the diamine compounds described in 63-056498, inorganic or organic salts of amino acids described in JP-A-63-130391, organic phosphonic acids containing —COOH or —OH, described in JP-A-63-145092, the compounds having an amino group and a phosphonic acid group, described in 63-165183, the specific carboxylic acid derivatives described in JP-A-2-316290, and coloring by acid contamination, described in JP-A-60-64352.

The light-sensitive layer exemplified below can be provided on the metal web to prepare a lead-frame forming material.

A first embodiment of the present invention using a light-sensitive layer containing a novolak resin of o-naphthoquinonediazidosulfonic acid ester and a phenol/cresol mixture is provided as follows:

An o-quinonediazide compound is an o-naphthoquinonediazide compound and is described in many publications including, for example, U.S. Pat Nos. 2,766,118, 2,767,092, 2,772,972, 2,859,112, 3,102,809, 3,106,465, 3,635,709, and 3,647,443, and they can be suitably used.

Of them, particularly preferred are o-naphthoquinonediazidosulfonic acid ester or o-naphthoquinonediazidocarboxylic acid ester of an aromatic hydroxy compound, and o-naphthoquinonediazidosulfonic amide or o-naphthoquinonediazidocarboxylic amide of an aromatic amine compound. In particular, very excellent are those obtained by subjecting o-naphthoquinonediazidosulfonic acid to an esterification reaction with the condensation product of pyrogallol and acetone, described in U.S. Pat. No. 3,635,709, those obtained by subjecting o-naphthoquinonediazidosulfonic acid or o-naphthoquinonediazidocarboxylic acid to an esterification reaction with polyester having a hydroxy group at a terminal, described in U.S. Pat. No. 4,028,111, those obtained by subjecting o-naphthoquinonediazidosulfonic acid or o-naphthoquinonediazidocarboxylic acid to an esterification reaction with a homopolymer of p-hydroxystyrene or a copolymer with the opther monomers copolymerizable therewith, described in British Patent 1,494,043, and those obtained by subjecting o-naphthoquinonediazidosulfonic acid or o-naphthoquinonediazidocarboxylic acid to an amide reaction to a copolymer of p-aminostyrene and the other copolymerizable monomers, described in U.S. Pat. No. 3,759, 711.

These o-quinonediazide compounds can be used singly but are used more preferably when mixed with an alkali soluble resin. A novolak type phenol resin is included in the suitable alkali soluble resin. Specific types of phenol resins include a phenol-formaldehyde resin, an o-cresol-formaldehyde resin, and a m-cresol-formaldehyde resin. Further, more preferred, is the combined use of the condensation product of phenol or cresol substituted with an alkyl group having a carbon number of 3 to 8 such as a t-butylphenol-formaldehyde resin with the phenol resin described above, as described in U.S. Pat. No. 4,028,111.

In order to form a visible image by exposure, there are added the compounds such as o-naphthoquinonediazido-4-sulfonyl chloride, an inorganic anionic salt of p-diazodiphenylamine, a trihalomethyloxadiazole compound, and a trihalomethyloxadiazole compound having a benzofuran ring. Also, there are used as a coloring agent for an image, a triphenylmethane dye such as Victoria Blue BOH, Crystal Violet, and Oil Blue. The dyes described in JP-A-62-293247 are particularly preferred.

Further, there can be incorporated as a fat-sensitizing agent, phenols substituted with an alkyl group having a carbon number of 3 to 15, described in JP-B-57-23253 (the term "JP-B" as used herein means an "examined Japanese patent publication"), for example, t-butylphenol, N-octylphenol, and a novolak resin obtained by condensing t-butylphenol with formaldehyde, or o-naphthoquinonediazido-4- or -5-sulfonic acid esters of such novlak resins (for example, they are described in JP-A-61-242446).

In order to improve developing performance, the nonionic surface active agents described in JP-A-62-251740 can further be incorporated into the light-sensitive composition.

The above composition is coated on a support, the respective components having been dissolved in a solvent. The solvent used herein includes ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propylacetate, methyl lactate, ethyl lactate, dimethylsulfoxide, dimethylacetamide, dimethylformamide, water, N-methylpyrrolidone, tetrahydrofurfuryl alcohol, acetone, diacetone alcohol, methanol, ethanol, isopropanol, and diethylene glycol dimethyl ether. These solvents are used singly or in admixture.

A light-sensitive composition comprising these components is applied in an amount of 0.5 to 3.0 g/m$^2$ in terms of solid matter.

A second embodiment of the present invention using a light-sensitive layer containing a diazo resin and a water insoluble and lipophilic high molecular compound is provided as follows:

There can be used as the diazo resin, for example, a diazo resin inorganic salt which is an organic solvent soluble reaction product of the condensation product of p-diazophenylamine and formaldehyde or acetaldehyde with a hexafluorophosphoric acid salt or tetrafluoroboric acid salt, and an organic solvent soluble diazo resin organic acid salt which is a reaction product of the condensation product mentioned above with sulfonic acids, for example, paratoluenesulfonic acid or the salt thereof, phosphinic acids, for example, benzenephosphinic acid or the salt thereof, or a hydroxy group-containing compound, for example, 2,4-dihydroxybenzophenone and 2-hydroxy-4-methoxybenzophenone-5-sulfonic acid or the salt thereof.

In the present invention, the other diazo resins which can suitably be used are an organic compound having at least one organic group of a carboxyl group, a sulfonic acid group, a sulfinic acid group, an oxygen acid group of phosphorus, and a hydroxyl group, and a copolycondensation product containing a diazonium compound, preferably an organic diazonium compound as a structural unit. A phenyl group and a naphthyl group can be enumerated as the above aromatic ring.

Various compounds can be enumerated as the above organic compound containing at least one of a carboxyl group, a sulfonic acid group, a sulfinic acid group, an oxygen acid group of phosphorus, and a hydroxyl group. Preferred are 4-methoxybenzoic acid, 3-chlorobenzoic acid, 2,4-dimethoxybenzoic acid, p-phenoxybenzoic acid, 4-anilinobenzoic acid, phenoxyacetic acid, phenylacetic acid, p-hydroxybenzoic acid, 2,4-dihydroxybenzoic acid, benzenesulfonic acid, p-toluenesulfinic acid, 1-naphthalenesulfonic acid, phenylphosphoric acid, and phenylphosphonic acid. The diazonium salts described in, for example, JP-B-49-48001 can be used for the aromatic diazonium compound constituting the structural unit for the copolycondesation diazo resin described above. Diphenylamine-4-diazonium salts are particularly preferred.

Diphenylamine-4-diazonium salts are derived from 4-aminodiphenylamines. There can be enumerated as such 4-aminodiphenylamines, 4-aminodiphenylamine, 4-amino-3-methoxydiphenylamine, 4-amino-2-methoxydiphenylamine, 4'-amino-2-methoxydiphenylamine, 4'-amino-4-methoxy-diphenylamine, 4-amino-3-methyldiphenylamine, 4-amino-3-ethoxydiphenylamine, 4-amino-3-b-hydroxyethoxy-diphenylamine, 4-amino-diphenylamine-2-sulfonic acid, 4-aminodiphenylamine-2-carboxylic acid, and 4-amino-diphenylamine-2'-carboxylic acid. Particularly preferred are 3-methoxy-4-amino-4-diphenylamine and 4-aminodiphenylamine.

There can also be preferably used as the diazo resins other than the copolycondensation diazo resin with an aromatic compound having an acid group, the diazo resin obtained by condensing with aldehyde having an acid group or the acetal compound thereof, described in JP-A-4-18559, JP-A-3-163551 and JP-A-3-253857.

Paired anion of the diazo resin includes anions which form stable salts with the diazo resin and make the resins soluble in an organic solvent. These include organic carboxylic acid such as decanoic acid, and organic phosphoric acid such as phenylphosphoric acid, and sulfonic acid. There can be enumerated as the typical examples thereof, methanesulfonic acid; fluoroalkanesulfonic acid such as trifluoromethanesulfonic acid; aliphatic and aromatic sulfonic acids such as laurylsulfonic acid, dioctylsulfosuccinic acid, dicyclohexylsulfosuccinic acid, camphorsulfonic acid, trioxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobebzenesulfonic acid, 2,5-dichlorobebzenesulfonic acid, sulfosalicylic acid, 2,5-dimethylbebzenesulfonic acid, p-acetylbebzenesulfonic acid, 5-nitro-o-toluenesulfonic acid, 2-nitrobebzenesulfonic acid, 3-chlorobebzenesulfonic acid, 3-bromobebzenesulfonic acid, 2-chloro-5-nitrobebzenesulfonic acid, butylbebzenesulfonic acid, octylbebzenesulfonic acid, decylbebzenesulfonic acid, dodecylbebzenesulfonic acid, butoxybebzenesulfonic acid, dodecyloxybebzenesulfonic acid, 2-hydroxy-4-methoxybenzophenone-5-sulfonic acid, isopropylnaphthalenesulfonic acid, butylnaphthalenesulfonic acid, hexylnaphthalenesulfonic acid, octyl-naphthalenesulfonic acid, butoxynaphthalene-sulfonic acid, dodecyloxynaphthalenesulfonic acid, dibutyl-naphthalenesulfonic acid, dioctyl-naphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid, and dimethyl-5-sulfoisophthalate; a hydroxy group-containing armatic compound such as 2,2',4,4'-tetrahydroxybenzophenone, 1,2,3-trihydroxybenzophenone, and 2,2',4-trihydroxybenzophenone; halogenated Lewis acid such as hexafluorophosphoric acid and tetrafluoroboric acid; and perhalogen acid such as $ClO_4$ and $IO_4$; but they are not limited thereto. Of them, particularly preferred are butyl-naphthalenesulfonic acid, dibutylnaphthalenesulfonic acid, hexafluorophosphoric acid, 2-hydroxy-4-methoxybenzophenone-5-sulfonic acid, and dodecylbenzenesulfonic acid.

In the diazo resin used in the present invention, a mole ratio of each monomer and a condensation condition can be changed in various ways to obtain the molecular weight thereof at an arbitrary value. In order to effectively meet the object of the present invention, the molecular weight thereof is suitably about 400 to 100,000, preferably about 800 to 8,000.

There can be used as the water insoluble and lipophilic high molecular compound, the copolymers shown at (1) to (15) listed below, having a monomer structural unit, and usually having a molecular weight of 10,000 to 200,000.

(1) Acrylamides, methacrylamides, acrylic esters, and methacrylic esters each having an aromatic hydroxyl group, and hydroxystyrenes, for example, N-(4-hydroxyphenyl) acrylamide or N-(4-hydroxyphenyl) methacrylamide, o-, m-, p-hydroxystyrene, and o-, m-, p-hydroxyphenyl acrylate or-methacrylate.

(2) Acrylic esters and methacrylic esters each having an aliphatic hydroxy group, for example, 2-hydroxyethyl acrylate or 2-hydroxyethyl methacrylate, and 4-hydroxy-butylmethacrylate.

(3) Unsaturated carboxylic acid such as acrylic acid, methacrylic acid, maleic anhydride, and itaconic acid.

(4) (Substituted)alkyl acrylate such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, glycidyl acrylate, and N-dimethylaminoethyl acrylate.

(5) (Substituted)alkyl methacrylate such as methyl methacrylate, ethyl methacrylate, propyl methacrylate, butyl methacrylate, amyl methacrylate, cyclohexyl methacrylate, benzyl methacrylate, glycidyl methacrylate, and N-dimethylaminoethyl methacrylate.

(6) Acrylamide or methacrylamide such as acrylamide, methacrylamide, N-methylolacrylamide, N-methylolmethacrylamide, N-ethylacrylamide, N-hexylmethacryl-amide, N-cyclohexylacrylamide, N-hydroxyethylacrylamide, N-phenylacrylamide, N-nitrophenylacrylamide, and N-ethyl-N-phenylacrylamide.

(7) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(8) Vinyl esters such as vinyl acetate, vinyl chloroacetate, vinyl butylate, and vinyl benzoate.

(9) Styrenes such as styrene, α-methylstyrene, and chloromethylstyrene.

(10) Vinyl ketones such as methyl vinyl ketone, ethyl vinyl ketone, propyl vinyl ketone, and phenyl vinyl ketone.

(11) Olefines such as ethylene, propylene, isobutylene, butadiene, and isoprene.
(12) Vinylpyrrolidone, N-vinylcarbazole, 4-vinylpyridine, acrylonitrile, and methacrylonitrile.
(13) Unsaturated imide such as maleimide, N-acryloylacrylamide, N-acetylmethacrylamide, N-propionyl-methacrylamide, and N-(p-chlorobenzoyl) methacrylamide.
(14) Methacrylic amides such as N-(o-aminosulfonylphenyl)methacrylamide, N-(m-aminosulfonylphenyl)methacrylamide, N-(p-aminosulfonylphenyl)methacrylamide, N-(1-(3-aminosulfonylnaphthyl)methacrylamide, and N-(2-aminosulfonylethyl)methacrylamide, and acrylamides having the same substituents as those described above; and methacrylic esters such as o-aminosulfonylphenyl methacrylate, m-aminosulfonylphenyl methacrylate, p-aminosulfonylphenyl methacrylate, and 1-(3-aminosulfonylnaphthyl)methacrylate, and acrylic esters having the same substituents as those described above.
(15) Unsaturated monomers having a crosslinkable group on a side chain, such as N-(2-(methacryloyloxy)-ethyl)-2,3-dimethylmaleimide, and vinyl cinnamate. Further, the monomers copolymerizable with the above monomers may be copolymerized.
(16) Phenol resins described in U.S. Pat. No. 3,751,257, and a polyvinylacetal resin such as, for example, a polyvinyl-formal resin and a polyvinylbutyral resin.
(17) High molecular compounds obtained by making polyurethane alkali soluble, described in JP-B-54-19773, and JP-A-57-94747, 60-182437, 62-58242, 62-123452, 62-123453, 63-113450, and 2-146042.

The preferred molecular weight of the above copolymers is 10,000 to 200,000.

Further, there may be added to the above copolymers according to necessity, a polyvinylbutyral resin, a polyurethane resin, a polyamide resin, an epoxy resin, a novolak resin, and a natural resin.

A dye can be further used for the light-sensitive composition according to the present invention for the purpose of obtaining a visible image by exposure and a visible image after developing.

With respect to the above dye, there can be used as a discoloring agent which changes from colored to colorless or a color tone of a different color, the dyes of a triphenylmethane series, a diphenylmethane series, an oxazine series, a xanthene series, an iminonaphthoquinone series, an azomethine series, or an anthraquinone series, represented by, for example, Victoria Pure Blue BOH (manufactured by Hodogaya Chemical Co., Ltd.), Oil Blue #603 (manufactured by Orient Chemical Ind. Co., Ltd.), Patent Pure Blue (manufactured by Sumitomo Mikuni Chemical Co., Ltd.), Crystal Violet, Brilliant Green, Ethyl Violet, Methyl Violet, Methyl Green, Erythrosine B Basic Fuchsine, Malachite Green, Oil Red, m-Cresol Purple, Rhodamine B, Auramine, 4-p-diethylaminophenyliminaphthoquinone, and cyano-p-diethylaminophenylacetanilide.

Meanwhile, there can be used as a discoloring agent which changes from colorless to colored, a leuco dye, and a primary or secondary arylamine series dye represented by, for example, triphenylamine, diphenyl amine, o-chloroaniline, 1,2,3-triphenylguanidine, naphthylamine, diaminodiphenylmethane, p,p'-bis-dimethylaminodiphenylamine, 1,2-dianilinoethylene, p,p',p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane, and p,p',p"-triaminotriphenylmethane. Particularly preferable to use are the triphenylmethane series and diphenyl-methane series dyes. It is further preferable to use the triphenylmethane series dye, particularly Victoria Pure Blue BOH.

Various additives can further be added to the light-sensitive composition according to the present invention. Preferably used are, for example, alkyl ethers for improving coating performance (for example, ethyl cellulose and methyl cellulose), fluorine series surface active agents and nonionic series surface active agents (the fluorine series surface active agents are particularly preferred), plasticizers for providing a coated film with flexibility and abrasion resistance (for example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer or polymer of acrylic acid or methacrylic acid; of them, tricresyl phosphate is particularly preferred), a fat-sensitizng agent for improving a fat-sensitization of an image (for example, a half-esterified product of a styrene-maleic anhydride copolymer with alcohol, described in JP-A-55-527, a novolak resin such as a p-t-butylphenol-formaldehyde resin, and 50% fatty acid ester of p-hydroxystyrene), a stabilizer [for example, phosphoric acid, phosphorous acid, organic acid (citric acid, oxalic acid, dipicolinic acid, benzenesulfonic acid, naphthalene-sulfonic acid, sulfosalicylic acid, 4-methoxy-2-hydroxybenzophenone-5-sulfonic acid, and tartaric acid), and a development accelerator (for example, higher alcohol and acid anhydride).

In order to provide the light-sensitive composition described above on a support, the prescribed amounts of a light-sensitive diazo resin, a lipophilic high molecular compound, and various additives as necessary are dissolved in a suitable solvent (methyl cellosolve, ethyl cellosolve, dimethoxyethane, diethyl glycol monomethyl ether, diethylene glycol dimethyl ether, 1-methoxy-2-propanol, methyl cellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethylsulfoxide, water, or the mixture thereof) to prepare a coating solution of the light-sensitive composition, and this may be coated on the support and dried.

The solvents may be used singly but more preferred is a mixture of a high boiling solvent such as methyl cellosolve, 1-methoxy-2-propanol and methyl lactate and a low boiling solvent such as methanol and methyl ethyl ketone.

The solid matter content of the light-sensitive composition in the coating falls desirably in the range of 1 to 50 weight %.

In this example, the coated amount of the light-sensitive composition is generally not much more than 0.2 to 100 g/m² (dry weight), more preferably 0.5 to 20 g/m².

A third embodiment of the present invention using a light-sensitive layer containing a photodimerization type light-sensitive composition and a photopolymerizable light-sensitive composition is provided as follows:

There can be used as the photodimerization type light-sensitive composition, the polymers having a maleimide group, a cinnamyl group, a cinnamoyl group, a cinnamylidene group, a cinnamylideneacetyl group, and a chalcone group at a side chain or a principal chain. There can be used as the polymer having a maleimide group at a side chain, the polymers described in JP-A-52-988 (corresponding to U.S. Pat. No. 4,079,041), German Patent 2,626,769, European Patents 21,019 and 3,552, and Die Angewandte Makromolekulare Chemie 115 (1983), pp. 163 to 181, and the polymers described in JP-A-49-128991, JP-A-49-128992, JP-A-49-128993, JP-A-50-5376, JP-A-50-5377, JP-A-50-5379, JP-A-50-5378, JP-A-50-5380, JP-A-53-5298, JP-A-53-5299, JP-A-53-5300, JP-A-50-50107, JP-A-51-47940, JP-A-52-13907, JP-A-50-45076, JP-A-52-121700, JP-A-50-10884, and JP-A-50-45087, and German Patents 2,349,948 and 2,616,272.

Effective for making these polymers soluble or swell in alkaline water are the polymers containing carboxylic acid, sulfonic acid, phosphoric acid, phosphonic acid, and the alkali metal salts thereof and ammonium salts, and an acid group having a pKa of 6 to 12 dissociated in alkaline water. One to three kinds of the monomers having the above acid groups can be compolymerized as well with the monomers having a maleimido group as necessary.

The acid value of a maleimide polymer having an acid group falls preferably in the range of 30 to 300. Of the polymers having such an acid value, effective is a copolymer of N-[2-(methacryloyloxy)ethyl]-2,3-dimethylmaleimide and methacrylic acid or acrylic acid, described at pages 71 to 91 of Die Angewandte Macromolekulare Chemie 128 (1984). Further, in synthesizing this copolymer, a vinyl monomer which is the third component can be copolymerized to readily synthesize a multi-copolymer as necessary. For example, alkyl methacrylate and alkyl acrylate, the homopolymer of which has a glass transition point of room temperature or lower can be used as a vinyl monomer of the third component to give flexibility to the copolymer.

The photopolymerizable polymers that can be used are photopolymerizable polymers having a maleimide group, a cinnamyl group, a cinnamoyl group, a cinnamylidene group, a cinnamylideneacetyl group, and a chalcone group at a side chain or a primary chain include light-sensitive polyesters described in U.S. Pat. No. 3,030,208.

The following ones can be used as those obtained by making these photopolymerizable polymers soluble in alkaline solution. That is, the light-sensitive polymers described in JP-A-60-191244 can be used.

Further, there can be used the light-sensitive polymers described in JP-A-62-175729, JP-A-62-175730, JP-A-63-25443, JP-A-63-218944, and JP-A-63-218945.

A sensitizer can be used in the light-sensitive layer. There can be used as such the sensitizer, a benzophenone derivative, a benz-anthrone derivative, quinones, an aromatic nitro compound, a naphtothiazoline derivative, a benzothiazoline derivative, thioxanthones a naphthothiazole derivative, a ketocoumarin compound, a benzothiazole derivative, a naphtofuranone compound, pyrylium salt, and thiapyrylium salt. There can be used in light-sensitive layer as needed, a binder such as chlorinated polyethylene, chlorinate poly-propylene, polyalkyl acrylate, a copolymer with at least one of the monomers such as alkyl acrylate, acrylonitrile, vinyl chloride, styrene, and butadiene, polyamide, methyl cellulose, polyvinylformal, polyvinylbutyral, a methacrylic acid copolymer, an acrylic acid copolymer, and an itaconic acid copolymer, and a plasticizer such as dialkyl phthalate including dibutyl phthalate and dihexyl phthalate, oligoethylene glycol alkyl ester, and phosphoric acid ester. A dye or a pigment and a pH indicator as a printing-out agent are preferably added as well for the purpose of coloring the light-sensitive layer.

There can be used as a photopolymerizable light-sensitive composition, unsaturated carboxylic acid and the salt thereof, ester of unsaturated carboxylic acid and aliphatic polyhydric alcohol, and amide of unsaturated carboxylic acid and aliphatic polyvalent amine compound.

A photopolymerization initiator includes vicpolyketoaldonyl compound, an a-carbonyl compound, acyloin ether, an aromatic acyloin compound in which an a-position is substituted with hydrocarbon, a poly-nuclear quinone compound, the combination of triallyl-imidazole dimer/p-aminophenyl ketone, a benzothiazole series compound, a trihalomethyl-s-triazine compound, acridine and phenazine compounds, and an oxadiazole compound. In addition to them, there can be used as a high molecular polymer, which is soluble or swelling in alkaline water and capable of forming a film, a benzyl (metha)acrylate/(metha)acrylic acid/other addition-polymerizable vinyl monomer as needed copolymer, a methacrylic acid/methyl methacrylate (or methacrylic ester) copolymer, those obtained by adding pentaerythritol acrylate to a maleic anhydride copolymer by half-esterification, and an acid vinyl copolymer.

A fourth embodiment of the present invention using an electrophotographic light-sensitive layer is provided as follows:

A TnO light-sensitive layer described in, for example U.S. Pat. No. 3,001,872 can be used. Further, there may be used a light-sensitive layer using an electophotographic light-sensitive material described in JP-A-56-161550, JP-A-60-186847 and JP-A-61-238063.

The amount of the light-sensitive layer provided on a support falls in the range of about 0.1 to about 7 $g/m^2$, preferably 0.5 to 4 $g/m^2$ in terms of dry weight after coating.

In the present invention, an intermediate layer may be provided as necessary for the purpose of increasing the adhesiveness between the support and the light-sensitive layer, allowing no light-sensitive layer to remain after development and preventing halation.

For improving the adhesiveness, the intermediate layer generally comprises, for example, a diazo resin, a phosphoric acid compound adsorbing, for examples on aluminum, an amino compound, and a carboxylic acid. The intermediate layer comprising a material having a high solubility, so that the light-sensitive layer does not remain after development generally comprises a polymer having good solubility and a water soluble polymer. Further, for the prevention of halation, the intermediate layer contains a conventional dye and a UV absorber. The thickness of the intermediate layer is arbitrary and has to be the thickness with which an even bond-forming reaction can be carried out with an upper light-sensitive layer during exposing. Usually, a coating proportion of about 1 to 100 $mg/m^2$ in terms of a dry substance is preferred and 5 to 40 $m/m^2$ is particularly preferred.

A matting layer composed of projections provided independently from each other can be provided on the coated light-sensitive layer.

The objects of the matting layer are to improve vacuum adhesion between a negative image film and a light-sensitive lithographic printing plate in contact exposure so as to shorten vacuum-pulling time and so as to prevent crash of a fine halftone dot during exposure due to poor contact.

A forming method for the matting layer includes a method in which a solid powder subjected to powdering is fused by heat, described in JP-A-55-12974, and a method described in JP-A-58-182636 in which a solid powder is applied to the coated light-sensitive layer and polymer-containing water is then sprayed and dried. Either method is applicable but it is desirable that the matting layer itself is dissolved in an aqueous alkali developing solution or can be removed thereby.

The lead-frame forming material thus prepared is subjected to an imagewise exposure and then to treatments including development according to a regular process to form a resin image. For example, where the lead-frame forming material having the light-sensitive layer of embodiment 1 described above, it is subjected to imagewise exposure and then to development in an alkali solution described in U.S. Pat. No. 4,259,434 to allow an exposed portion to be removed, whereby a lead frame is obtained. Where the lead-frame forming material having the light-sensitive layer of embodiment 2 described above, it is subjected to imagewise exposure and then a light-sensitive layer at an unexposed portion is removed by development in a developing solution described in U.S. Pat. No. 4,186,006, whereby a lead-frame is obtained. Further, there may be used the aqueous alkali developer compositions used in developing the positive type lithographic printing plates, described in JP-A-59-84241, JP-A-57-192952 and JP-A-62-24263.

According to the present invention, since a metal web is continuously subjected in regular succession to a degrease treatment and an acid cleaning treatment and a light-sensitive material is coated on the treated metal web thus obtained, followed by drying, there is no opportunity for foreign matter to mix in between the metal surface and the light-sensitive layer.

Further, since after coating the light-sensitive material on the metal web, it is cut in fixed lengths along a longitudinal direction of the lead-frame forming material, plural sheets of the lead-frame forming metal plate having uniform quality can be manufactured at the same time in large volume.

EXAMPLE 1

One example of the present invention is explained below.

A roll of copper alloy web (Fe 0.2%, P 0.1%, Mn 0.01%, Sn 0.5%, and the balance Cu) with a thickness of 0.15 mm and a width of 400 mm was set in "an unwinder" and treated in sodium hydroxide 15% at the temperature of 60° C. for 300 seconds by feeding from "the unwinder". After washing with water, it was treated in sulfuric acid 10% at the temperature of 60° C. for 20 seconds and washed with water. The following light-sensitive solution was coated and then dried, followed by continuously treating and windings it into a roll by a length of 500 m. They were designated as Sample [A] and cut to the length of 500 mm to prepare 1000 sheets ($A_1$ to $A_{1000}$).

| Composition of the Light-Sensitive Solution Coated: | |
| --- | --- |
| Copolymer (average molecular weight: 60000) of N-(4-hydroxyphenyl)methacrylamide/2-hydroxylmethacrylate/acrylonitrile/methyl methacrylate/methacrlic acid (= 10:20:25:35:10 mole ratio) | 5.0 g |
| Hexafluorophosphoric acid salt of the condensation product of 4-diazophenyl-amine and formaldehyde | 0.5 g |
| Phosphorous acid | 0.05 g |
| Victoria Pure Blue BOH | 0.1 g |
| Water | 5.0 g |
| 1-Methoxy-2-propanol | 45.0 g |
| Methyl ethyl ketone | 50.0 g |

Light-sensitive solution-coated and dried Samples ($A_1$ to $A_{1000}$) thus obtained were used to contact an etching pattern image forming film original plate on a light-sensitive layer of a lead-frame forming metal plate, and after exposure, it was developed. A light-sensitive material at an unexposed portion was removed and then the lead frame-forming metal plate was dipped in an etchant (a ferric chloride solution) to remove an etching portion, whereby 1000 sheets of a desired lead frame were manufactured.

COMPARATIVE EXAMPLE

There were prepared 1000 sheets of a copper alloy plate (Fe 0.2%, P 0.1%, Mn 0.01%, Sn 0.5%, and the balance Cu) with a plate thickness of 0.15 mm, a width of 400 mm and a length of 500 mm, and they were treated one by one in sodium hydroxide 15% at the temperature of 60° C. for 300 seconds in a batch treatment. After washing with water, it was treated in sulfuric acid 10% at the temperature of 60° C. for 20 seconds and washed with water, followed by coating the following light-sensitive material one by one. These are designated as Samples $B_1$ to $B_{1000}$.

| Light-sensitive solution: | |
| --- | --- |
| Copolymer (average molecular weight: 60000) of N-(4-hydroxyphenyl)methacrylamide/2-hydroxylmethacrylate/acrylonitrile/methyl methacrylate/methacrylic acid (= 10:20:25:35:10 mole ratio) | 5.0 g |
| Hexafluorophosphoric acid salt of the condensation product of 4-diazophenyl-amine and formaldehyde | 0.5 g |
| Phosphorous acid | 0.05 g |
| Victoria Pure Blue BOH | 0.1 g |
| Water | 5.0 g |
| 1-Methoxy-2-propanol | 45.0 g |
| Methyl ethyl ketone | 50.0 g |

Light-sensitive solution-coated and dried Samples ($B_1$ to $B_{1000}$) thus obtained were used to contact an etching pattern image-forming film original plate on a light-sensitive layer of a lead frame-forming metal plate, and after exposure, it was developed. A light-sensitive material at an unexposed portion was removed and then the lead frame-forming metal plate was dipped in an etchant (a ferric chloride solution) to remove an etching portion, whereby the desired lead frames were manufactured.

The comparison between Samples ($A_1$ to $A_{1000}$) prepared in Example of the present invention and Samples ($B_1$ to $B_{1000}$) prepared in Comparative Example showed that troubles occurred in only 2 sheets of Samples ($A_1$ to $A_{1000}$) but in 68 sheets of Samples ($B_1$ to $B_{1000}$).

The time required to manufacture Samples ($A_1$ to $A_{1000}$) was 2 hours while the time required to manufacture Samples ($B_1$ to $B_{1000}$) was 15 hours.

In the above example, the example in which a lead frame-forming base material consisting of mainly copper or copper-nickel alloy was used, but there may be used an alloy material obtained by adding an active metal element such as titanium and chromium to these alloy materials so as not to be limited to these alloys.

As apparent from the above disclosure, since a metal web is continuously subjected in regular succession to a degrease treatment and an acid cleaning treatment and a light-sensitive material is coated on the treated metal web thus obtained, followed by cutting it in fixed lengths along a longitudinal direction after drying, whereby plural sheets of a lead-frame forming material are manufactured or winding it into a roll, the lead-frames in which no foreign matter are mixed in between the metre surface and the light-sensitive layer and which has an even quality can be manufactured at the same time in large volume.

What is claimed is:

1. A manufacturing process for producing a lead-frame forming material comprising:

continuously subjecting a metal web consisting essentially of copper or a copper-nickel alloy to a degrease treatment and an acid cleaning treatment, coating a light-sensitive material on said metal web, followed by drying to form a light-sensitive layer, cutting the resulting coated metal web into fixed lengths along a longitudinal direction or winding the resulting coated metal web into a roll, and forming a matting layer on the light-sensitive material.

2. The manufacturing process according to claim 1 further comprising:

coating an intermediate layer on said metal web thus obtained before coating said light-sensitive material to increase the adhesiveness between the metal web and the light-sensitive material.

* * * * *